US006667702B2

(12) United States Patent
Sasaki et al.

(10) Patent No.: US 6,667,702 B2
(45) Date of Patent: Dec. 23, 2003

(54) SEMICONDUCTOR DEVICE HAVING DACS AND METHOD OF TESTING SUCH SEMICONDUCTOR DEVICE

(75) Inventors: Jun Sasaki, Kyoto (JP); Yasunori Kawamura, Kyoto (JP)

(73) Assignee: Rohm Co., LTD, Kyoto (JP)

( * ) Notice: Subject to any disclaimer, the term of this patent is extended or adjusted under 35 U.S.C. 154(b) by 54 days.

(21) Appl. No.: 10/127,197

(22) Filed: Apr. 19, 2002

(65) Prior Publication Data

US 2002/0180626 A1 Dec. 5, 2002

(30) Foreign Application Priority Data

Apr. 27, 2001 (JP) .................................... 2001-130516
May 18, 2001 (JP) .................................... 2001-150182

(51) Int. Cl.[7] .............................................. H03M 1/06
(52) U.S. Cl. ........................................ 341/120; 341/144
(58) Field of Search ................................. 341/120, 121, 341/144, 155

(56) References Cited

U.S. PATENT DOCUMENTS 5,973,631 A  * 10/1999 McMullen .................. 341/121

* cited by examiner

Primary Examiner—Brian Young
(74) Attorney, Agent, or Firm—Hogan & Hartson (57) ABSTRACT

A semiconductor device equipped with a DAC channel has a test pattern generation means for storing and generating test patters, and a test clock input terminal. The test pattern generation means generates a test digital signal representing a test pattern based on the high-frequency (e.g. 135 MHz) test clock input to the test clock input terminal. The test digital signal is supplied to the input end of the DAC channel. Using the test digital signals supplied from the test signal generation means, the semiconductor device can be tested in various high-frequency test modes without any tester outputting high-frequency test signals.

14 Claims, 9 Drawing Sheets

FIG. 8
EXAMPLE 3: PULSE (1/2, 2/4, 1/16)

FIG. 9

SEMICONDUCTOR DEVICE HAVING DACS AND METHOD OF TESTING SUCH SEMICONDUCTOR DEVICE

FIELD OF THE INVENTION

The invention relates to a semiconductor device having a digital-to-analog converters (DACs) for use in digital TV set, DVDs, and game machines, and more particularly to such semiconductor device having DACs suitable for testing the semiconductor device. The invention also relates to a method of testing a semiconductor device.

BACKGROUND OF THE INVENTION

In digital TV sets, DVDs, and game machines, data processing of a video signal for example is first performed in digital form and then the digital data is converted to an analog data prior to outputting the data. To perform the conversion, a DAC is used. Of course such DAC is integrated in an integrated circuit, so that a dedicated tester is used to assess its performance.

Figure 1:
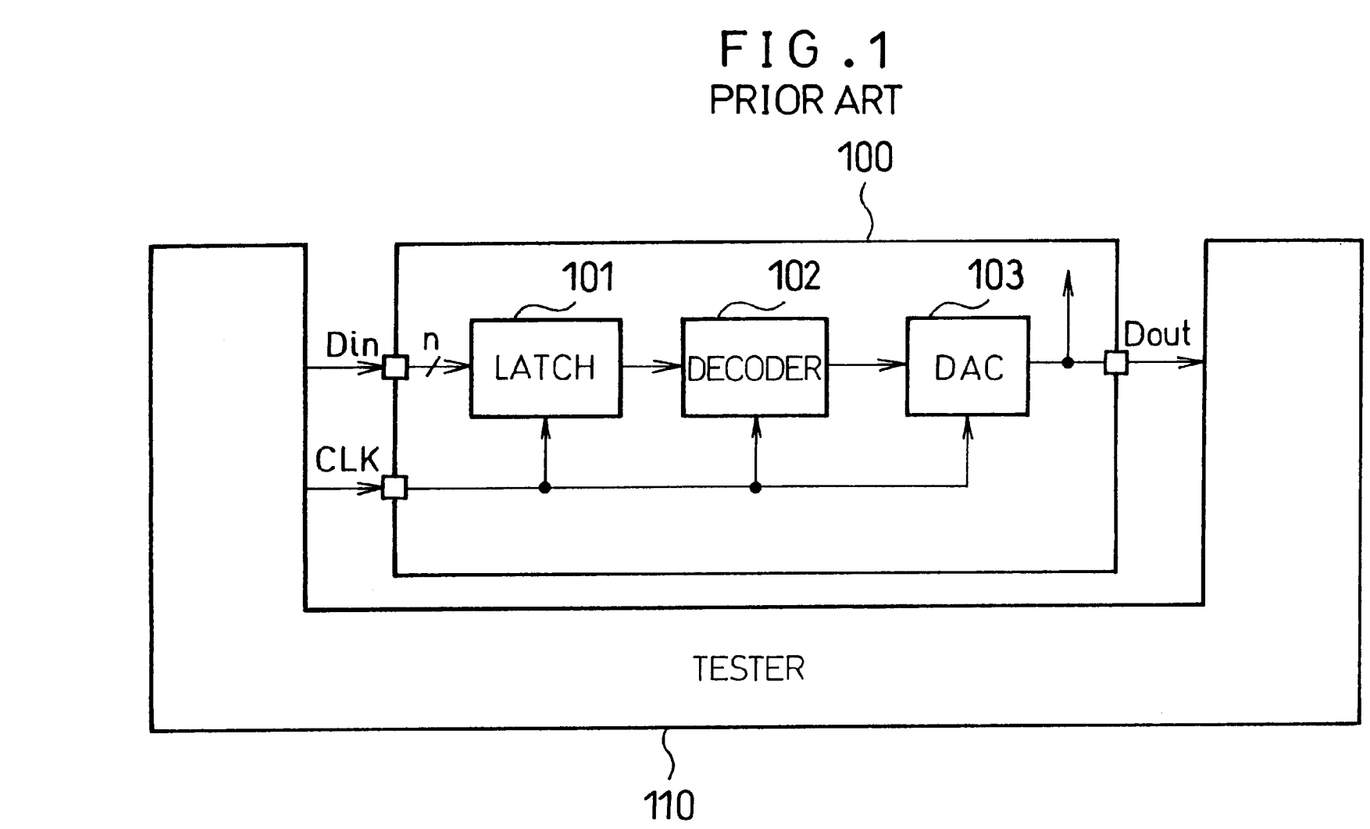
FIG. 1 is a block diagram representation of test system for testing a conventional semiconductor device having a DAC.

FIG. 1 is a block diagram representation of a conventional semiconductor 100 having a DAC. As shown in FIG. 1, the semiconductor device 100 is provided with n-bit digital input signal Din and a clock CLK. The input signal Din is latched in a latch circuit 101, decoded in a decoder 102, and then converted into an analog signal by a DAC 103. The converted analog signal is output from the DAC as the analog output signal Dout.

In testing the semiconductor device 100, it is connected to a tester 110. The tester 110 provides to the semiconductor device 100 a digital input signal Din and a clock CLK which are identical to the signals actually supplied to the semiconductor device 100. The output analog signal Dout is assessed by the tester.

When the semiconductor device 100 is designed for a high-frequency (e.g. 135 MHz) video signal, the performance of the DAC in the high-frequency range must be verified. In general, distortions of the output analog signal Dout are measured for a given digital input signal Din to analyze various characteristics of the DAC 103. To do this, the tester 110 provides a digital sinusoidal wave signal and a clock to the semiconductor device 100, and distortions of the analog signal output from the semiconductor device 100 are measured by a spectrum analyzer set up in the tester 110.

Thus, in testing the semiconductor device having a DAC, a tester capable of outputting high frequency signals in different test modes is necessary. That is, the high-frequency tester 110 must be capable of realizing various problematic conditions that it might encounter in the measurements of high frequency signals as output from the semiconductor device, for example variation in capacitance of wires, signal delays in the wires, and timing violation in the semiconductor. Because of this requirement, the tester is considerably expensive as compared with ordinary mass-produced testers (e.g. testers designed to output a signal of 40 MHz). Consequently, a capital investment for the testers greatly affects the manufacturing cost of the semiconductor device having a DAC.

SUMMARY OF THE INVENTION

It is therefore an object of the invention to provide a semiconductor device having DACs that can be successfully tested in various high-frequency modes without using a tester capable of outputting high-frequency digital test signals.

It is another object of the invention to provide a method of testing a semiconductor device having such DACs.

In accordance with one aspect of the invention, there is provided a semiconductor device equipped with at least one channel of DAC for converting a digital signal input to the semiconductor device into an analog signal before it is output from the semiconductor device, the semiconductor device comprising:

test pattern generation means for storing and generating test patterns; and a clock input terminal which can receive a test clock during a test, wherein the test pattern generation means generates a digital test signal representing a test pattern based on a test clock supplied to the clock input terminal during a test, and provides the digital test signal and the test clock to the DAC channel.

In testing the semiconductor device equipped with such DAC according to the invention, the device only require a fast test clock, which can be easily generated and supplied from an external clock generator. Based on this test clock, a high-frequency digital test signal representing a prescribed test pattern can be generated by the test pattern generation means and provided to the DAC channel, so that the DAC can be tested for the high-frequency signal as in the test using a high-frequency tester.

Therefore, although the semiconductor device requires therein such pattern generation means, it can be provided at low cost since no expensive tester generating a high frequency test signal is required to test the device.

The semiconductor device may further comprise a test mode input terminal for receiving a test mode signal indicative of a test mode supplied to the test pattern generation means so that, based on the test clock received through the test clock terminal during a test, the test pattern generation means generates a digital test signal representing the test pattern designated by the test mode signal.

In this way, many of the characteristics of the DAC can be tested using different test patterns in accord with various test modes.

The semiconductor device may comprise an additional test power supply terminal for supplying a voltage higher than the operating voltage of the DAC to the test pattern generation means. This will improve the performance of the test pattern generation means and allow it to operate at a higher speed. Thus, it is possible to minimize the size of the test pattern generation means while driving it faster, which helps minimization of the chip size of the semiconductor device.

The semiconductor device shown herein has six channels of DACs (referred to as DAC channels) such that the three DACs in the first three DAC channels and the three DACs in the second three DAC channels can be separately tested. The first three channels include a composite signal channel, a brightness channel, and a chromatic signal channel, while the second three channels include a brightness signal channel, a first color difference signal channel, and a second color difference signal channel. Hence, six channels can be tested using three testing elements by switching the first and the second three channels.

The semiconductor device has a multiplicity of DAC channels such that the DACs in the respective channels can be individually tested. This can be done by turning off the DACs (thereby causing the DACs to generate outputs at an intermediate level), except one DAC. This arrangement enables measurement of cross talks between the active (ON) channel and rest of the inactive (OFF) channels.

The test pattern generation means may store sinusoidal wave test patterns to generate a sinusoidal wave test pattern in accord with a designated test mode when said test mode is a sinusoidal wave test mode. These sinusoidal wave test patterns have different combinations of frequencies, amplitudes, and DC biases in combination. In some of the test modes, the sinusoidal wave test pattern has an arbitrary number of the lower bits fixed to zero.

In such test mode, the level and/or the distortion of a high-frequency signal can be tested. Different frequencies, levels (in amplitude/accuracy) and DC biases may be used in combination to carry out varied sinusoidal wave tests. In addition, bit-drop by the DAC may be tested by evaluating the level of the analog signal output therefrom, based on the fact that the level of the output analog signal varies if the input digital signal is missing certain bits.

The test pattern generation means may store square wave test patterns to generate a square wave test pattern in accord with a designated test mode when the test mode is a square wave test mode. These square wave test patterns have different periods, duty cycles, amplitudes, and DC biases in combination. The amplitude of the square wave pattern may have an arbitrary number of lower bits fixed to zero.

In these square wave test modes, it is possible to evaluate glitch energy and the transient response of the DAC at the rise/fall of the signal. Various tests may be also carried out using different square wave test patterns having different periods, duty cycles, levels (amplitudes/precisions), and DC biases. In addition, bit-drop by the DAC may be tested by evaluating the level of the analog signal output therefrom, based on the fact that the level of the output analog signal varies if the input digital signal is missing certain bits.

The DAC may be a current additive type DAC which comprises:
  a set of multiple conversion units connected in parallel, each unit having a constant current element controlled by a reference potential and a switching element connected in series with said constant current element and adapted to be turned ON/OFF by a control signal based on the input digital data;
  reference potential generation means for generating said reference potential;
  a reference potential line for providing said reference potential to each of said constant current elements of said conversion units, wherein
  the reference potential generation means has a potential feedback means for setting low its impedance of the reference generation means as viewed from the reference potential line.

In this arrangement of the current additive type DAC, the impedance of the reference potential generation means is set low as viewed from the reference potential line so that the cutoff frequency as determined by the floating static capacitance and the impedance of the reference potential generation means is shifted to a higher frequency, so that the variation of the reference potential on the reference potential line is reduced, resulting in a high fidelity D/A conversion.

In accordance with the invention, there is provided a method of testing a semiconductor device having DACs for converting digital signals into analog signals, utilizing a tester having a slower processing speed than the DACs, wherein the tester has means for generating a test clock; the semiconductor device has test pattern generation means for storing and generating test patterns for testing at least a portion of the performance of the DACs, and a clock input terminal which can receive the test clock to drive the test pattern generation means by the test clock, said method comprising steps of:

supplying a test clock from the tester to the test pattern generation means via said clock input terminal;
  causing the test pattern generation means to generate a digital test signal in synchronism with the test clock;
  supplying the test clock and the digital test signal to the DACs to convert the digital test signal into an analog signal; and
  assessing the analog signal by the tester.

The method of the invention allows tests of the DACs at high frequency without using an expensive tester that generates high-frequency digital test signals.

DETAILED DESCRIPTION OF THE PREFERRED EMBODIMENT

Figure 2:
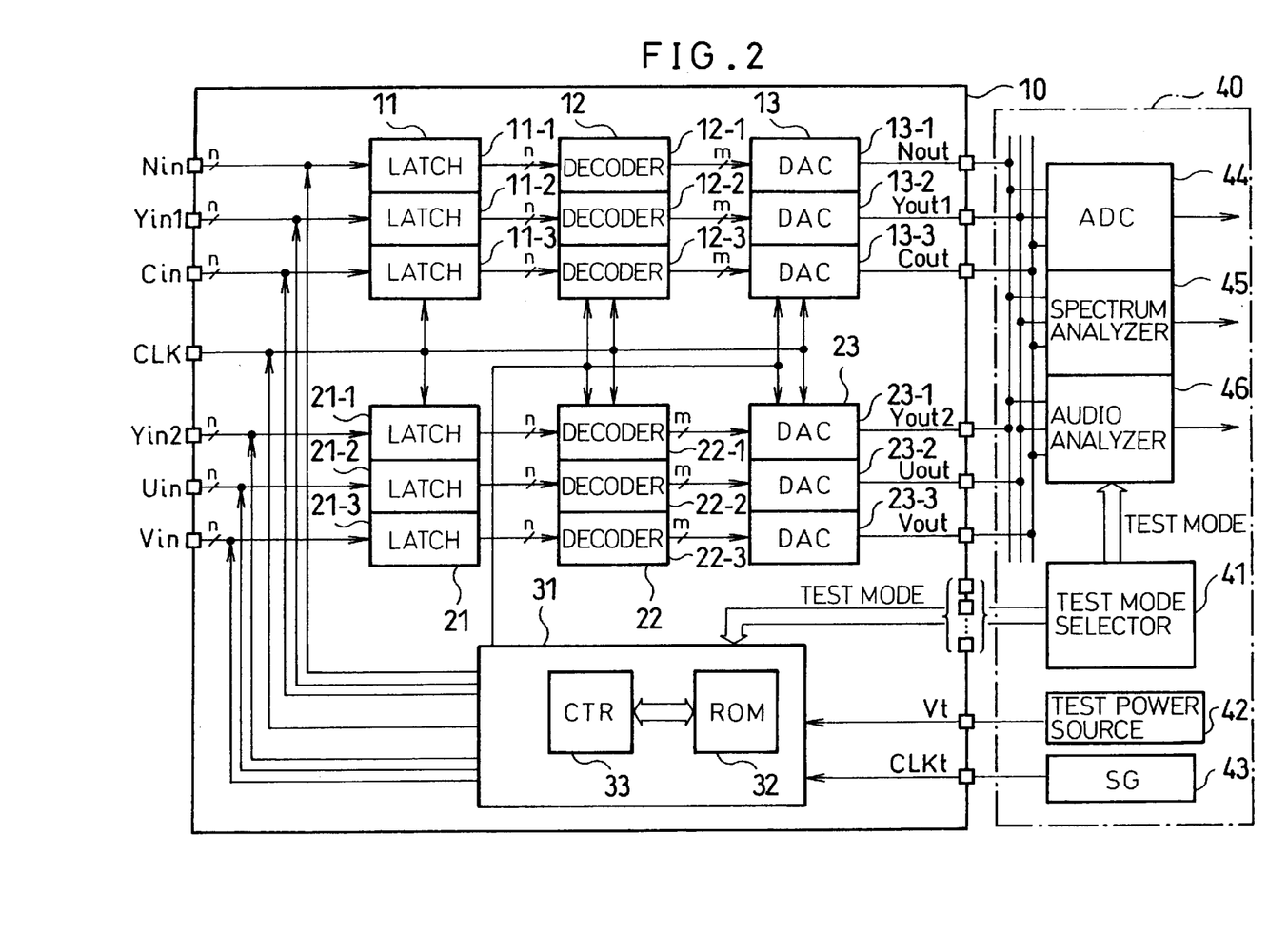
FIG. 2 is a schematic circuit diagram of a semiconductor device having DAC channels according to the invention, and a tester.

FIG. 2 schematically shows the structure of a semiconductor device 10 having DAC channels according to the invention, along with a tester 40. In this figure, the semiconductor device 10 is assumed to have six DAC channels.

We first describe the structure of the semiconductor device 10. As shown in FIG. 2, an n-bit composite digital signal Nin includes all the signals necessary for a color picture such as a brightness signal Y, a chromatic signal for orthogonal phase modification of a first and a second color difference signals B-Y and R-Y, respectively, which are modulated by a sub-transmission wave (which has 3.58 MHz in NTSC system or 4.43 MHz in PAL system), and horizontal/vertical synchronizing signals. The number of bits, n, can be 10 for example. It is assumed that other digital signals have the same number of bits, unless otherwise stated. Other portions of the circuit not relevant to the inventive DAC channels are omitted in FIG. 2.

A first digital brightness signal Yin1 includes horizontal and vertical synchronizing signals. Digital chromatic signal Cin includes a first color difference signal B-Y, and a second color difference signal R-Y.

Of these 3-channel signals, the first digital brightness signal Yin1 and the digital chromatic signal Cin constitutes a set of color signals. Since the set of color signals separately includes the first digital brightness signal Yin1 and digital chromatic signal Cin, Y/C separation is not needed to obtain a color image of good quality. The digital composite signal Nin alone includes another set of color signals.

A second digital brightness signal Yin2 is the same as the first digital brightness signal Yin1. Digital first color difference signal Uin is a B-Y signal, while digital second color difference signal Vin is an R-Y signal. The 3-channel signals consisting of the second digital brightness signal Yin2, a first digital color difference signal Uin, and a second digital color difference signal Vin, together form a set of color signals. Since the brightness signal and the respective color difference signals are separately formed in the set, no Y/C separation nor separation of the chromatic signal is needed. Hence, color pictures of exceedingly high-fidelity may be obtained.

These 6-channel digital signals, that is, the composite signal Nin, brightness signal Yin1, chromatic signal Cin, brightness signal Yin2, first color difference signal Uin, and second color difference signal Vin, are formed from a set of RGB color signals. They are synchronized to the same clock. System clock CLK is provided to a first set of latch circuits 11 (latch circuits 11-1-11-3), a first set of decoders 12 (decoders 12-1-12-3), a first set of DACs 13 (DACs 13-1-13-3), a second set of latch circuits 21 (latch circuits 21-1-21-3), a second set of decoders 22 (decoders 22-1-22-3), and a second set of DACs 23 (DACs 23-1-23-3). The 6-channel digital signals and the system clock CLK supplied to the semiconductor device 10 are high frequency signals of 135 MHz, for example.

The first three of the 6-channel digital signals are latched by the respective latch circuits 11-1-11-3. The latched digital signals are decoded by the respective decoders 12-1-12-3 and then converted into analog signals by the respective DACs 13-1-13-3. They are output as analog composite signal Nout, first analog brightness signal Yout1, and analog chromatic signal Cout, respectively. It is noted that each of the decoders 12-1-12-3 is adapted to decode an n-bit digital signal into predetermined m-bit codes adequate for the DACs 13-1-13-3, so that the decoders 12-1-12-3 may not be necessary for a certain-type of the DACs 13-1-13-3. This is also the case in other channels.

Similarly, in the second three channels, digital signals are latched by the respective latch circuits 21-1-21-3, decoded by the respective decoders 22-1-22-3, and converted to analog signals by the respective DACs 23-1-23-3. They are output as a set of second analog brightness signal Yout2, analog first color difference signal Uout, and analog second color difference signal Vout.

In place of the set of color signals consisting of the second digital brightness signal Yin2, digital first color difference signal Uin, and digital second color difference signal Vin, another set of color signals Rin, Gin, and Bin may be used.

Figure 3:
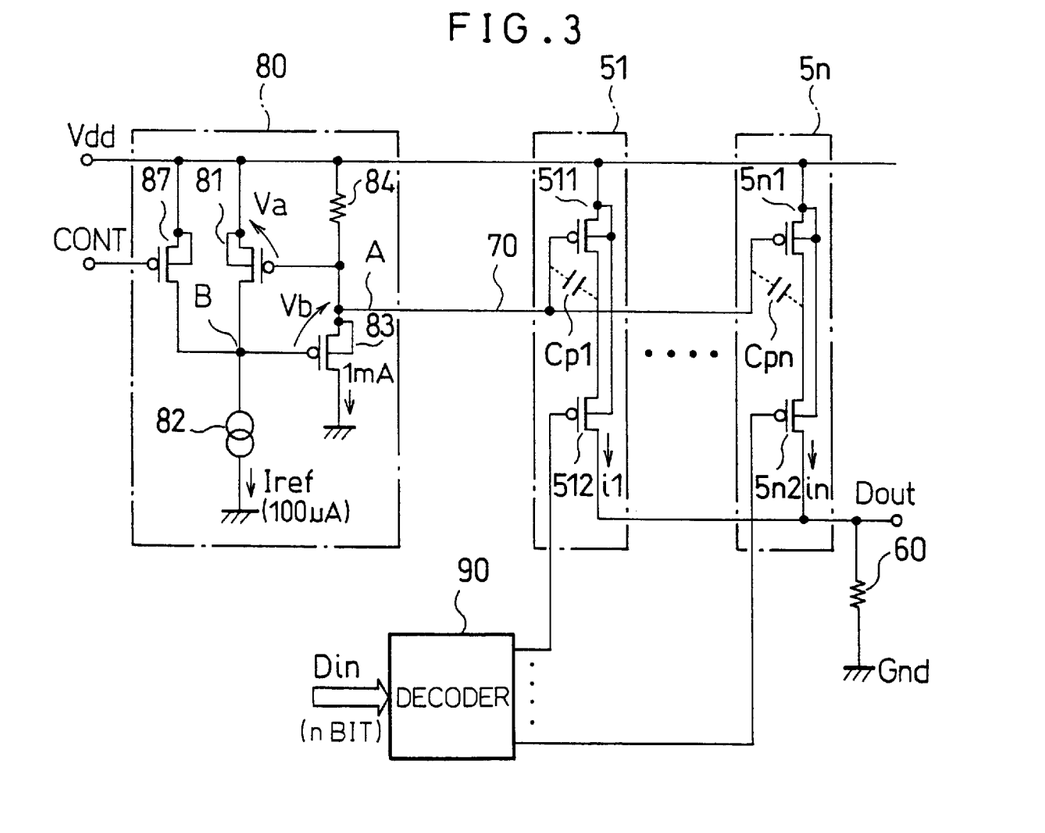
FIG. 3 is a circuit diagram of preferred DAC channels according to the invention.
Figure 4:
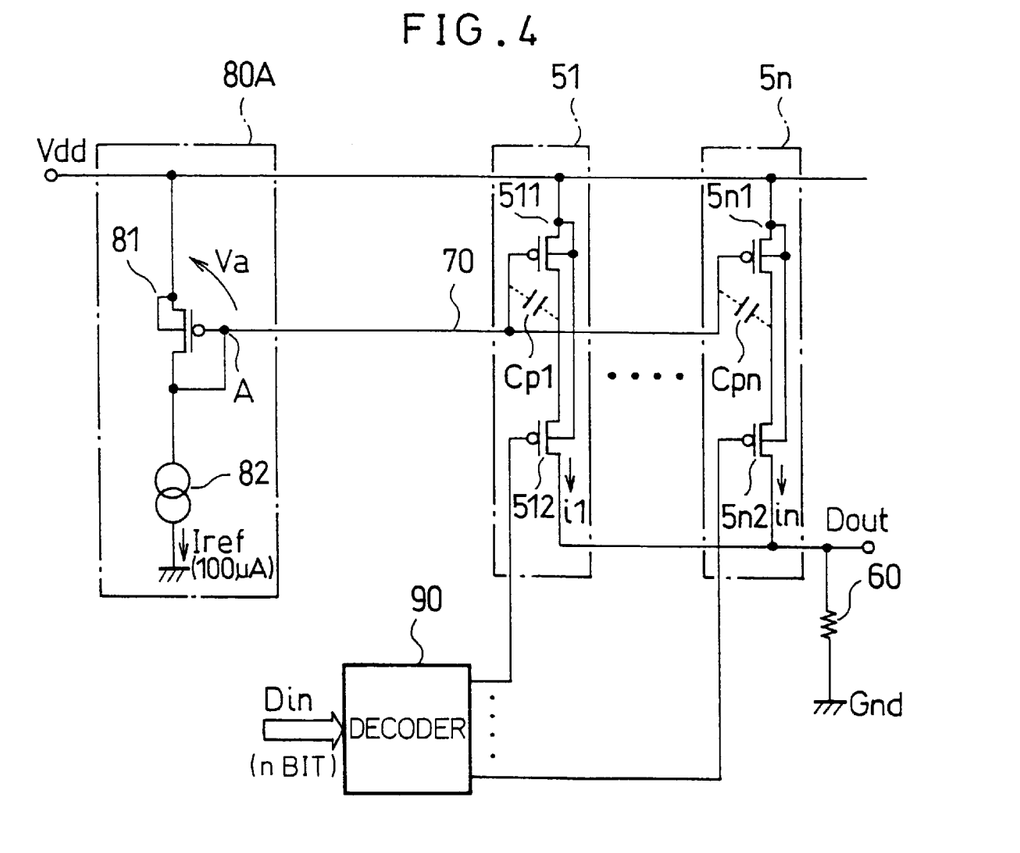
FIG. 4 is a circuit diagram shown for explanations of the DAC of FIG. 3.
Figure 5:
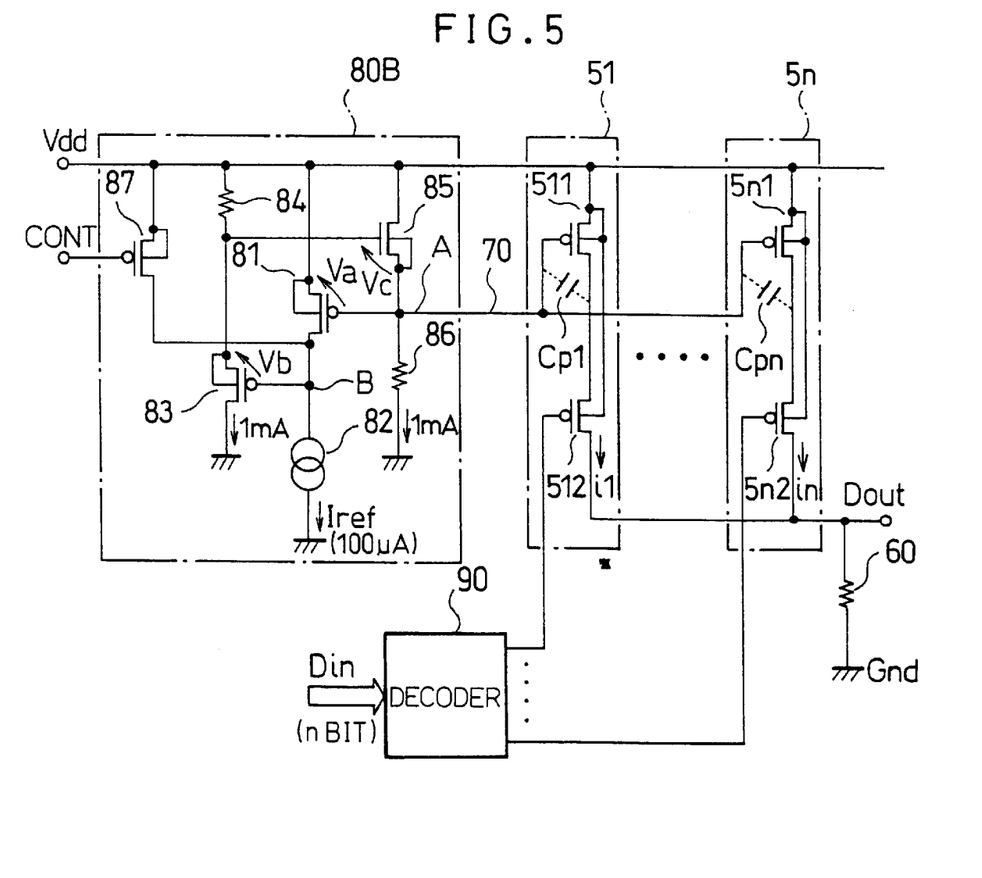
FIG. 5 is the circuit diagram of another preferred DAC according to the invention.

The DACs 13-1-13-3 and 23-1-23-3 of the invention have a circuit structure that is adequate for high speed operation to deal with high frequency signals. FIGS. 3 and 5 illustrate preferred current additive type DACs. FIG. 4 illustrates a current additive type DAC which is useful in understanding the operation of the DACs shown in FIGS. 3 and 5.

The DAC of FIG. 3 has conversion units 51–5n for converting coding signals into analog current signals. Each of the conversion units 51–5n is provided with a respective p-type MOS FET (hereinafter referred to as p-type transistor) 511–5n1 serving as a constant current element and a respective p-type transistor 512–5n2 serving as a switching element. The gates of the p-type transistors 511–5n1 are connected with a reference potential line 70 which is in turn coupled with a reference potential generation means 80.

Receiving an input n-bit (e.g. 10 bits) digital signal Din, a decoder 90 decodes it into predetermined m-bit codes, which are applied to the respective gates of the p-type transistors 512–5n2 as ON/OFF signals.

These conversion units 51–5n are connected in parallel and provide constant currents i1–in as determined by the codes supplied thereto by the decoder 90. These currents are added together to a current in the range of 0 to several 10 mA before it is supplied to a resistive load 60.

The reference potential generation means 80 has a structure as described below. A first p-type transistor 81 is connected in series with a constant current power circuit 82 which is configured to provide a reference current Iref of 100 µA for example. They are connected between a source potential Vdd and the ground potential Gnd. Connected between the gate of the first p-type transistor 81 and the ground potential Gnd is a second p-type transistor 83. The gate of the second p-type transistor 83 is connected to the drain of the first p-type transistor 81. Connected between the gate of the first p-type transistor 81 and the source potential Vdd is a resistor 84.

In addition, connected in parallel with the first p-type transistor 81 is a third p-type transistor 87 which is driven by a control signal CONT to make the current additive type DAC operable or inoperable. The p-type transistor 87 is turned ON or OFF in accordance with the potential level of the control signal CONT applied to the gate of the transistor 87. The second p-type transistor 83 is configured such that a current of about 1 mA flows through it when the current additive type DAC is in operation.

Because of this reference potential generation means 80, the third p-type transistor 87 is turned ON and the second p-type transistor 83 is turned OFF when the control signal CONT is pulled down to a low level (LOW), points B and A (and hence the reference potential line 70) have a potential close to the source potential Vdd, thereby rendering the current additive type DAC inoperable. Since the second p-type transistor 83 is turned OFF under this inoperative condition of the DAC, no wasteful current flows through the transistor 83.

When the control signal CONT is pulled up to a high level (HIGH), the third p-type transistor 87 is turned OFF to make the current additive type DAC operable, thereby bringing potentials at points B and A (and hence the potential of the reference potential line 70) to the reference potential. This reference potentials is applied via the reference potential line 70 to the gates of the respective p-type transistors 511–5n1 serving as constant current-controlled elements of the respective conversion units 51–5n.

Particularly in the DAC shown in FIG. 3, the second p-type transistor 83 and the resistor 84 together function as a potential feed back means for setting low the impedance of the reference potential generation means 80 as viewed from the reference potential line 70.

Accordingly, the influence of potential variation on the reference potential line 70 via floating capacitances Cp1–Cpn caused by the switching of the respective conversion units 51–5n is reduced. As a result, variations in the gate voltages of the p-type transistors 511–5n1 of the conversion units 51–5n become small. Hence, provision of the output current i1–in by the respective conversion units 51–5n is stabilized, thereby permitting high-quality D/A conversion.

Referring to FIG. 4 which illustrates a typical DAC for better understanding of the invention, operation of the inventive DAC shown in FIG. 3 will now be described. Like reference numerals denote like or corresponding elements in the two Figures.

The DAC shown in FIG. 4 differs from the DAC of the invention shown in FIG. 3 in that the former has a reference potential generation means 80A, which includes a p-type transistor 81 and a constant current source 82 such that the gate and drain of the transistor 81 are connected together. The rest of the elements of the DAC 80A are the same as the corresponding elements of the DAC of the invention.

As will be understood from FIG. 4, the current Ids passing through the transistor 81 is given by $$Ids = k(Va-Vt)^2 \qquad (1)$$

where k is a constant parameter having a value, Va is voltage between the source and the gate (hereinafter referred to as source-gate voltage) of the transistor 81, and Vt is threshold voltage.

To evaluate the AC component of the current, Equation (1) is integrated. The result is $$\partial Ids/\partial Va = 2k(Va-Vt) \qquad (2)$$

so that the impedance Za at point A is given by $$Za = \partial Va/\partial Ids = 1/\{2k(Va-Vt)\} \qquad (3).$$

For example, if $k=625\times10^{-6}$, Va=1.0 (V), and Vt=0.6 (V), then the impedance Za=2 (KΩ).

Assuming that the parasitic capacitance Cp (Cp1–Cpn) is 5 (pF), the cutoff frequency Fc defined by Fc=1/(2πZa Cp) of the high-pass filter formed of the parasitic capacitance Cp and the impedance Za turns out to be about 16 MHz.

With this cutoff frequency Fc (=16 MHz), DACs for video signals for example which undergo high frequency switching (typically at 135 MHz) will be affected by the floating capacitance Cp.

In the invention, the DAC as shown in FIG. 3 lowers the impedance Z of the reference potential generation means 80 as viewed from the reference potential line 70 so that the cutoff frequency Fc determined by the floating capacitance Cp and the impedance Z is shifted to a higher frequency.

The first and the second p-type transistors 81 and 83 of FIG. 3 may be the same as the p-type transistor 81 of FIG. 4. The constant current source 82 may be the same as the corresponding constant current source 82 of FIG. 4. Then, given a source-gate voltage Vb of 1.865 (V), currents Ids1 and Ids2 passing through the first and the second p-type transistors 81 and 83, respectively, turns out to be:

$$Ids1 = k(Va-Vt)^2 = 625\times10^{-6}\times(1.0-0.6)^2 \qquad (4)$$
$$= 100 \text{ (μA)}$$

$$Ids2 = k(Vb-Vt)^2 = 625\times10^{-6}\times(1.865-0.6)^2 \qquad (5)$$
$$= 1 \text{ (mA)}.$$

The mutual conductance Gm of the first p-type transistor 81 is $$Gm = \partial Ids1/\partial Va = 2k(Va-Vt) = 0.5\times10^{-3}.$$

The mutual conductance Gm has a negative feedback in such a way that if the potential at point A lowers, Ids1 of the first p-type transistor 81 increases to raise the potential at point B, which in turn raises the potential at point A by the source follower action of the second p-type transistor 83. Thus, if the impedance of the constant current source 82 is 100 KΩ for example, the feedback gain equals $100\times10^3\times Gm$ or about 50.

The impedance Z83 of the second p-type transistor 83 is given by $$Z83 = \partial Vb/\partial Ids2 = 1/\{2k(Vb-Vt)\} = 632(Ω) \qquad (3).$$

Under the feedback effect, the impedance Za at point A is then $$632(Ω)\times1/50 = 12.64(Ω).$$

This impedance Za at point A is the impedance Z of the reference potential generation means 80 as viewed from the reference potential line 70. Thus, if the parasitic capacitance Cp (Cp1–Cpn) is assumed to be 5 (pF) as of the DAC shown in FIG. 4, the cutoff frequency Fc of the high-pass filter made up of the parasitic capacitance Cp and the impedance Z is given by $$Fc = 1/(2\pi Z Cp),$$

which is about 2.5 GHz.

Since this cutoff frequency Fc (=2.5 GHz) is sufficiently higher than the frequency of Video signals in the neighborhood of 135 MHz, the DAC will not be affected by the floating capacitance Cp associated with the switching of the conversion units.

Furthermore, since the reference potential generation means 80 is provided with the third p-type transistor 87 which is turned ON/OFF in accordance with the operative and inoperative status of the DAC, power consumed by the DAC is reduced when the DAC is not in operation.

FIG. 5 shows a preferred current additive type DAC in the form of a semiconductor integrated circuit (IC) according to the invention. The DAC shown in FIG. 5 has the same structure as the one shown in FIG. 3 except that the reference potential generation means 80B differs from the corresponding potential generation means 80. The rest of the elements are the same in both Figures.

The reference potential generation means 80B is formed as follows. A first p-type transistor 81 and a constant current source 82 providing a reference current Iref (which is 100 μA for example) are connected in series between the source potential Vdd and the ground potential Gnd. A resistor 84 and a second p-type transistor 83 are connected in series between the source potential Vdd and the ground potential Gnd, with the gate of the second p-type transistor 83 connected with the drain of the first p-type transistor 81. Connected between the gate of the first p-type transistor 81 and the power supply voltage Vdd is an n-type MOS FET (hereinafter referred to as n-type transistor) 85, with the gate of the n-type transistor 85 connected with the source of the second p-type transistor 83. Connected between the gate of the first p-type transistor 81 and the ground potential Gnd is a resistor 86.

In addition, as in the example shown in FIG. 3, a third p-type transistor 87 driven by a control signal CONT is connected in parallel with the first p-type transistor 81 to control the operation of the current additive DAC.

The DAC of FIG. 5 has a feature that it can be used with a lower voltage power source. On the other hand, in the DAC of FIG. 3, the impedance Z of the reference potential generation means 80 is set low so as to shift the cutoff frequency Fc to a high frequency, based on the fact that Fc is determined by the floating capacitance Cp and the impedance Z. However, this configuration is not suited to a case where a low voltage power supply is used, since the source-gate voltage Va of the first p-type transistor 81 plus the source-gate voltage Vb of the second p-type transistor 83 is applied in series, making the potential at point B as low as Vdd−Va−Vb=Vdd−2.865 (V).

In contrast, in the DAC of FIG. 5, the potential at point B becomes Vdd−Va+Vc−Vb, where Va, Vb, and Vc are the source-gate voltage of the first p-type transistor 81, second p-type transistor 83, and the n-type transistor 85, respectively. Therefore, if the circuit parameters are adjusted to make Vc equal to Vb, the potential at point B becomes Vdd−Va, which is sufficiently high even when a low voltage power supply is used.

Incidentally, it would be understood that although the DAC shown in FIG. 5 works through the n-type transistor 85, its operation is essentially the same as the DAC of FIG. 3, and further details of the operation will not be repeated here.

It would be noted that in either of the current additive DACs of FIGS. 3 and 5, the impedance of the reference potential generation means 80/80B as viewed from the reference potential line 70 is set low, so that the cutoff frequency Fc determined by the floating capacitance Cp and the impedance of the reference potential generation means 80/80B is shifted to a higher value, thereby reducing the variation of the potential of the reference potential line 70 and allowing highly accurate D/A conversion.

Referring back to FIG. 2 again, the test pattern generation circuit 31 is shown to include a ROM 32 as a storage device, and a control section CTR33. The ROM 32 stores various n-bit (e.g. 10-bit) test pattern data. Under the control of the control section CTR 33, a particular test pattern stored in the ROM 32 is retrieved in the form of digital data. The retrieved test pattern is supplied as a digital input signal to the digital input terminals and to the respective latches 11-1-21-3 along with a test clock CLKt. The test clock CLKt has the same frequency of 135 MHz as the system clock CLK. It is noted that the impedance of the test pattern generation circuit 31 is set high (Hi-Z) unless it is in test operation that the output from test pattern generation circuit 31 will not affect the digital input signal during a normal operation.

The test patterns stored in the ROM 32 may be categorized into sinusoidal wave patterns and square wave patterns.

The sinusoidal wave patterns include many combinations of various frequencies, levels (in amplitude and accuracy), and DC biases. The square wave patterns include many combinations of various periods, duty ratios, levels (in amplitude and accuracy), and DC biases. It should be understood that the levels (in amplitude and accuracy) implies here various amplitudes of the test digital signals and accuracies of the amplitudes available in the test.

The test pattern generation circuit 31 is supplied with a test mode signal from the tester 40 via a test mode designation terminal provided in the semiconductor device 10. The test mode specifies which one of the test patterns stored in the ROM 32 is to be generated in the test. The test clock CLKt having the same frequency of 135 MHz as the system clock CLK is also supplied from the tester 40 to the test pattern generation circuit 31 via the test clock input terminal.

It is noted that the test pattern generation circuit 31 is provided with a test power supply terminal for receiving a test voltage Vt independently of the proper power supply voltage Vdd (not shown) which for the semiconductor device 10. For example, latches 11-1-11-3, decoders 12-1-12-3, and DACs 13-1-13-3 utilize the nominal voltage of the power supply voltage Vdd (which is for example 2.5 V). On the other hand, the test power supply voltage Vt supplied to the test pattern generation circuit 31 may be higher (e.g. 4 V) than the nominal voltage (2.5 V) within a permissible voltage range.

Such a higher test power supply voltage Vt than the nominal voltage of the semiconductor device 10 improves operability of each circuit element and increases the operating speed thereof. Accordingly, the dimensions of the test pattern generation circuit 31 may be minimized while increasing its operating speed, so that the size of the entire semiconductor chip need not be increased by the test pattern generation circuit 31.

It is noted that it does not matter if it is used under a severe condition than normal operating condition, since the test pattern generation circuit 31 is used only in the test of the semiconductor device 10 unlike other circuit elements.

Next, the tester 40 will now be described. The tester 40 need not a fast digital circuit except for a clock generator SG 43. That is, it can work with a semiconductor device 10 if it is capable of outputting slower digital data than the semiconductor device 10. In this sense the tester 40 is different from conventional ones.

The test mode designation section 41 is adapted to instruct the test pattern generation circuit 31 which test mode is to be used in the test stored in the test pattern generation circuit 31. The test pattern generation circuit 31 then generates the test pattern-required in the designated mode. At the same time the designated test mode is informed to a test evaluation means provided in the tester 40 for evaluating the test.

The test power supply 42 generates test power supply voltage Vt, which is supplied to the test pattern generation circuit 31. The test power supply voltage Vt (4 Volts for example) is higher than the nominal operating voltage (2.5 V) of the semiconductor device 10. The SG 43 comprises an oscillator generating a test clock CLKt having the same frequency 135 MHz as that of the system clock CLK. The test clock CLKt is provided to the test pattern generation circuit 31.

The test evaluation means comprises an analog-to-digital converter (referred to as ADC), a spectrum analyzer 45, and an audio analyzer 46.

The ADC 44 is adapted to convert analog test data received from the semiconductor device 10 into a fast (e.g. 20 MHz) digital data to provide measured data in digital form. The spectrum analyzer 45 also analyzes the analog signal indicative of the test result by measuring the spectrum of the data, which is suited for evaluating the distortion of a sinusoidal wave. The audio analyzer 46 also performs frequency analysis of the analog test data to obtain frequency distribution thereof, which is suited for the evaluation of low-frequency components of a signal (e.g. below 100 KHz).

Based on the evaluations made by the ADC 44, spectrum analyzer 45, and audio analyzer 46, a pass-fail determination is made on the first and the second sets of DACs 13-1-13-3, 23-1-23-3. It may be appreciated that a high-frequency digital signal is not involved in the tester 40 so that timing of the digital elements is simple.

A process of testing the semiconductor device 10 having such a DAC as described above by using the tester 40 will now be described.

First, a test mode is set in a test mode designation section 41. The data indicative of the test mode is supplied to the test pattern generation circuit 31, ADC 44, spectrum analyzer 45, and audio analyzer 46 via test mode instruction terminals thereof. The test pattern generation circuit 31 is also supplied with a test clock CLKt from the SG43 and a test power supply voltage Vt from the power source 42 for the test (referred to as test power source).

A digital test signal for the designated test mode generated by the test pattern generation circuit 31 and the test clock CLKt are input to the first set of latch circuits 11-1-11-3 or the second set of latch circuits 21-1-21-3. The digital signal is converted into analog signal by means of the first set of latch circuits 11-1–11-3, decoders 12-1–12-3, and DACs 13-1–13-3, or by the second set of latch circuits 21-1–21-3, decoders 22-1–22-3, and DACs 23-1–23-3. The analog signal is fed to the evaluation means (i.e. ADC 44, spectrum analyzer 45, and audio analyzer 46) of the tester 40 for evaluation. Based on the evaluation, pass-fail determinations of the first and the second sets of DACs 13-1–13-3 and 23-1–23-3 are performed.

Test modes used in the invention will now be further described in detail. The test modes can be categorized into two groups: a first test mode for simultaneously testing three channels; and a second test mode for testing individual DACs of the three channels independently by turning OFF the DACs except for one.

In the first test mode, either three channels of composite signal Nin channel, first brightness signal Yin1 channel, and chromatic signal Cin channel or of second brightness signal Yin2 channel, first color difference signal Uin channel, and second color difference signal Vin channel can be simultaneously tested. Thus, all the 6 channels of the two sets of three channels can be tested using three-channel evaluation means by switching off one of the sets.

In the second test mode, three channels of one set can be individually turned ON/Off for a test. If the outputs of the DAC channels to be turned OFF are fixed to an intermediate level, cross talks between the operative and inoperative channels may be measured.

Each of the first and the second test modes may be further categorized into two groups. They are: (a) sinusoidal wave test modes in which a level and distortion of a high-frequency input signal can be tested, and (b) square wave test modes in which glitch energy and transient response at a rise/fall of wave can be tested.

In the sinusoidal wave modes, out of various sinusoidal wave patterns stored in the ROM 32, a desired sinusoidal wave pattern having in combination a desired frequency, level (amplitude or accuracy), and DC bias is selected. For example, a frequency may be selected from 2.4 MHz (=135 MHz×73/4096), 11.6 MHz (135 MHz×11/128), and 1.55 MHz (135 MHz×1/128). An accuracy mode is provided in which a few lowest bits of 10-bit signal are fixed to zero to test bit dropping by a DAC. In a DC bias test mode, a predetermined DC value is added to a sinusoidal wave.

Figure 6:
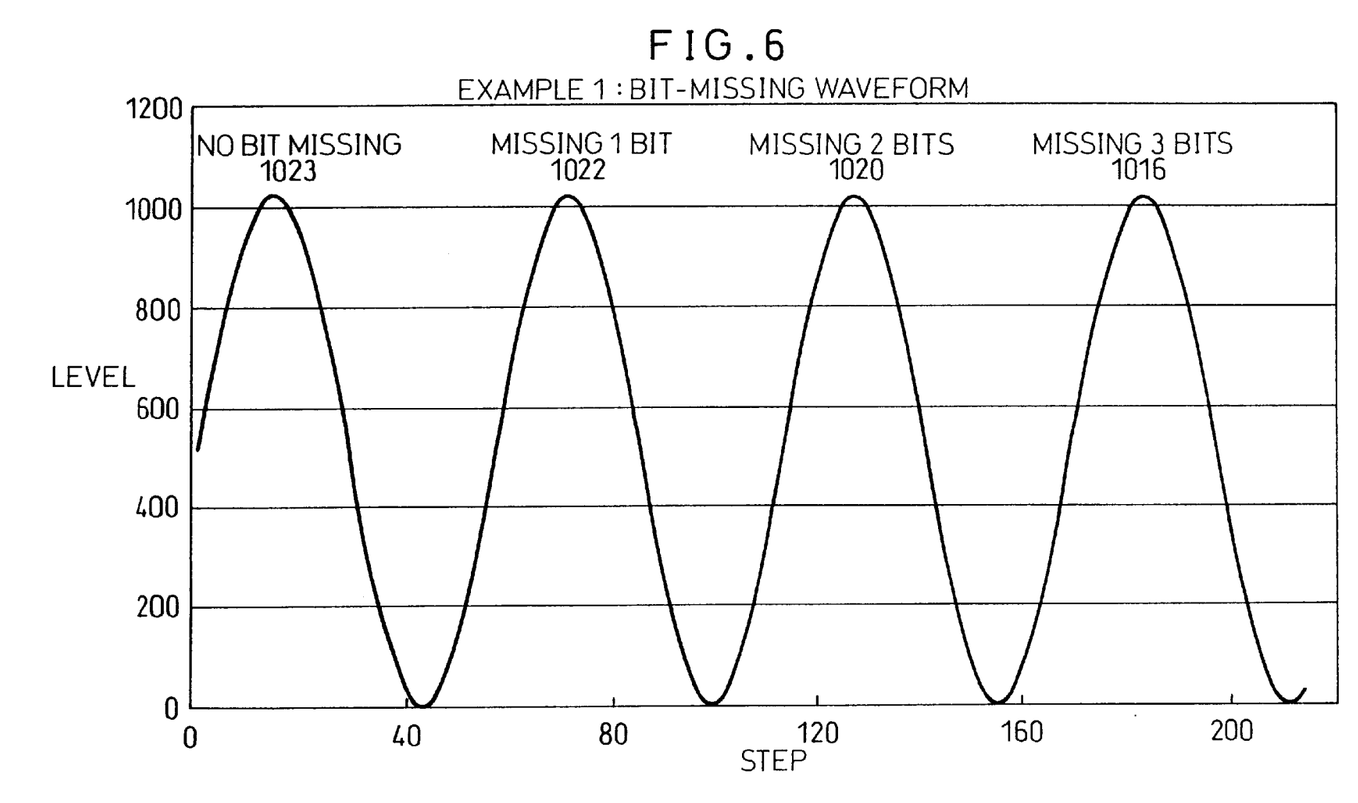
FIG. 6 shows a test pattern for use in a sinusoidal wave test.
Figure 7:
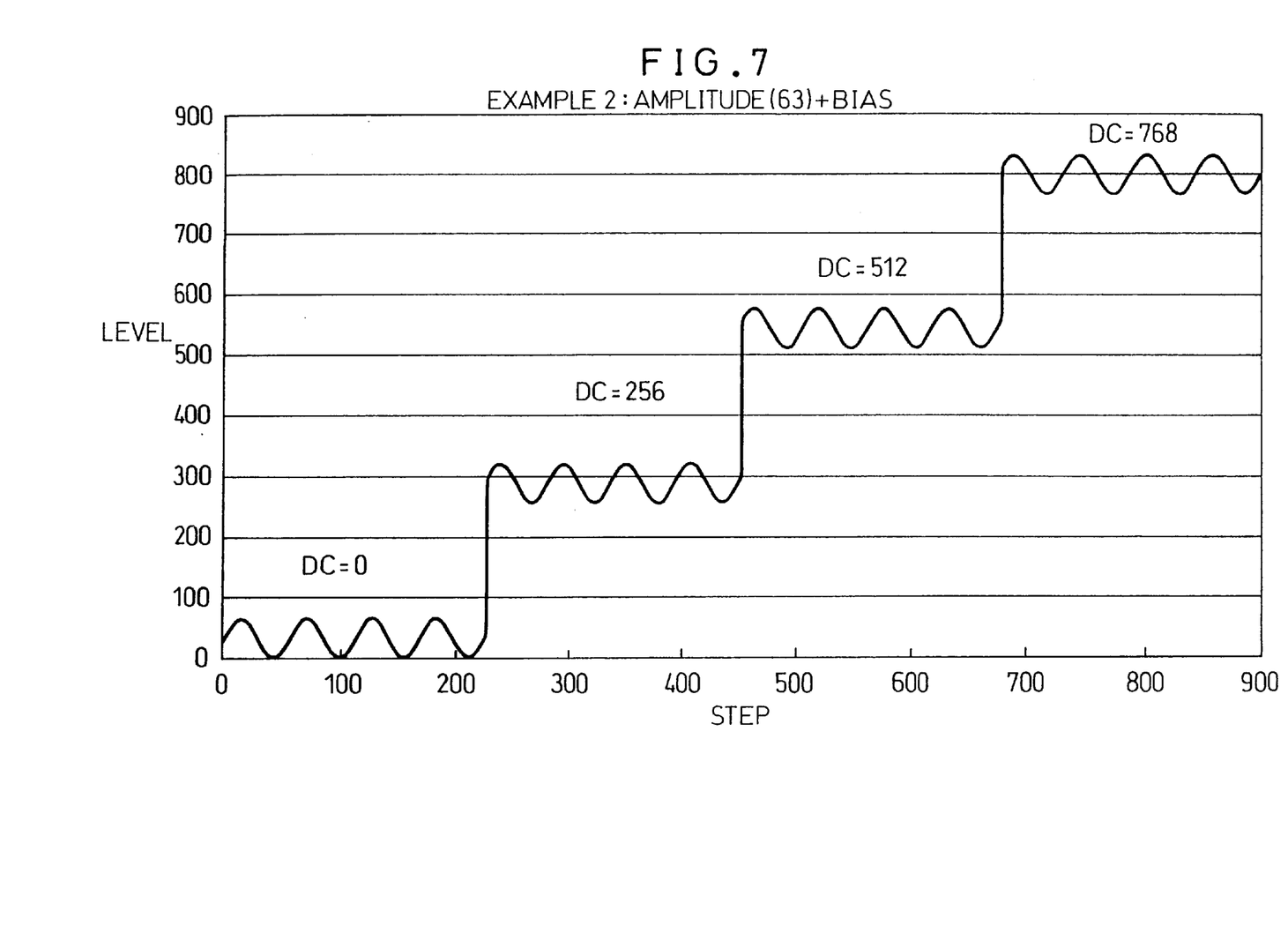
FIG. 7 shows another test pattern for use in another sinusoidal wave test.

The test patterns for use in these test modes are illustrated in FIGS. 6 and 7. FIG. 6 shows a 10-bit sinusoidal wave pattern having a full scale level of 1023, with its lowest one, two, and three bit(s) sequentially dropped off in time. Since the level of the output analog signal changes if bit-dropping occurs in the DAC, it is possible to test bit-dropping by the DAC through observation of the output level of the DAC. FIG. 7 shows a pattern in which a sinusoidal wave having its upper 6 bits shifted to the lower bits is level-shifted in sequence by three different DC biases of 0, 256, 512, and 768. In this mode, video signals having a DC component superposed with AC components may be tested. "Steps" on the abscissas of FIGS. 6 and 7 denotes the number of clocks.

In these sinusoidal wave modes, a sinusoidal wave having a given frequency of 2.4 MHz (135 MHz×73/4096) for example goes through all the levels from 0 to 10 bits (0–1023) over one or more periods. These modes permits sophisticated or higher-level reliability tests of the DAC.

In the square wave modes, out of various square wave patterns stored in the ROM 32, a desired square wave pattern having in combination a desired frequency, level (in amplitude or accuracy), and DC bias is selected. For example, a duty ratio can be selected from 1/2, 2/4, 1/16, and 15/16. As in sinusoidal wave test mode, an accuracy mode is provided in which a few lowest bits of 10-bit signal fixed to zero to test bit dropping by a DAC. In a DC bias mode, a predetermined DC current is added to a square wave.

Figure 8:
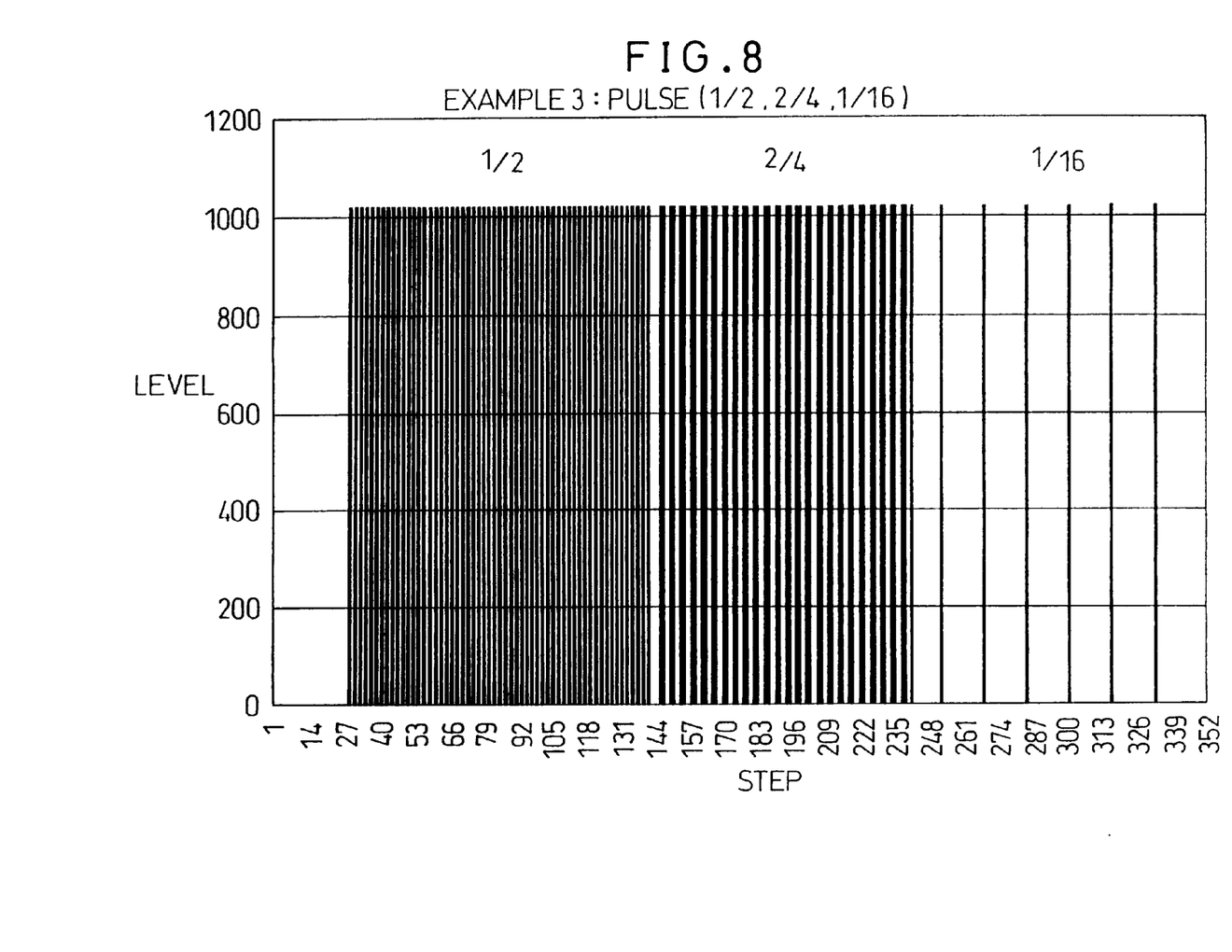
FIG. 8 shows a test pattern for use in a square wave test.
Figure 9:
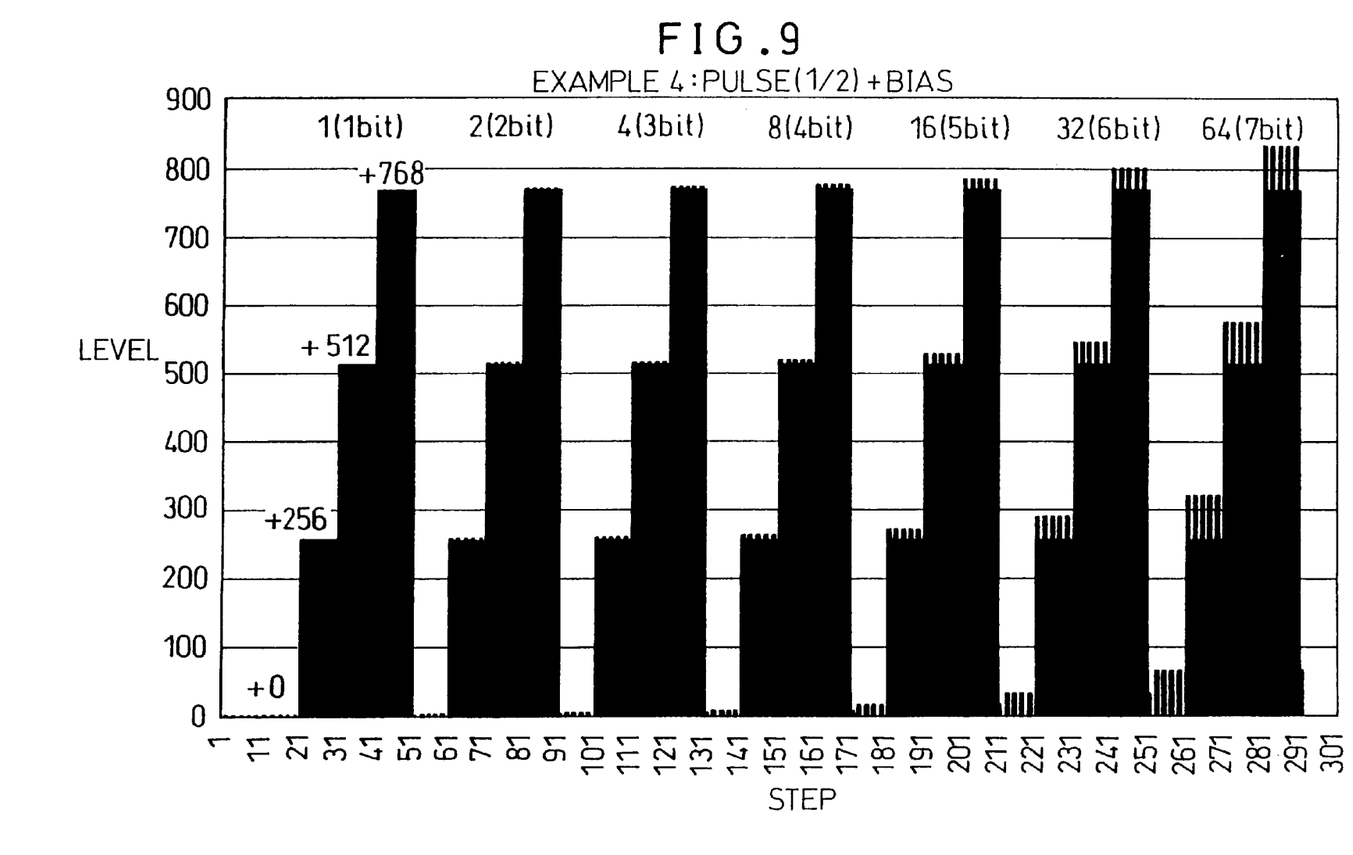
FIG. 9 shows another test pattern for use in another square wave test.

The test patterns for use in these test modes are illustrated in FIGS. 8 and 9. FIG. 8 shows a 10-bit square wave pattern having a full scale level of 1023, which sequentially changes its period from 2 Step to 4 and 16 Steps and its duty ratio from 1/2 to 2/4 and 1/16. These changes in the digital signal in the square wave tests are reflected in the output level of the analog signal, from which results of a test can be obtained.

FIG. 9 shows a square wave pattern in which a square wave having a period of 2 Steps and duty ratio of 1/2 is generated, which changes its DC bias cyclically from 0 to 256, 512, and 768, and its lowest 1–7 bits varied. This wave pattern can be used to test, for example, a video signal having a DC component superposed with an AC component. Also in FIGS. 8 and 9, "Step" on the respective abscissas denotes the number of clocks.

As describe above in detail, various test patterns can be selectively output from the test pattern generation circuit 31 (ROM 32) in the form of digital data by the test mode designation section 41 to the internal DACs 13-1–13-3 or 23-1–23-3 together with a clock in accordance with an external test clock CLKt.

What we claim is:

1. A semiconductor device having at least one channel of DAC for converting a digital signal input to the input terminal of said DAC channel into an analog signal and providing said analog signal at the output terminal of said channel, said semiconductor device comprising:

test pattern generation means for storing and generating test patterns; and a clock input terminal which can receive a test clock during a test, wherein
   said test pattern generation means generates a digital test signal representing a test pattern based on a test clock supplied to said clock input terminal during a test, and provides said digital test signal and the test clock to said DAC channel.

2. The semiconductor device according to claim 1 further comprising an input terminal for inputting a test mode signal to said test pattern generation means; wherein
   said test pattern generation means generates, based on said clock during a test, a digital test signal representing the test pattern in accord with said test mode specified by said test mode signal, thereby supplying said digital test signal and said clock to said DAC channel.

3. The semiconductor device according to claim 2 further comprising a test power supply terminal for receiving and supplying to said test pattern generation means a voltage higher than the operating voltage of said DAC.

4. The semiconductor device according to claim 2, wherein said semiconductor device comprises six DAC channels such that the first three DAC channels and the second three DAC channels are switchable for a test.

5. The semiconductor device according to claim 4, wherein
   said first three channels include a composite signal channel, a brightness signal channel, and a chromatic signal channel, and
   said second three channels include a brightness signal channel, a first color difference signal channel, and a second color difference signal channel.

6. The semiconductor device according to claim 2, wherein
said semiconductor device has a multiplicity of DAC channels such that only one DAC channel is tested at a time by setting the remaining DAC channels to generate outputs at an intermediate level.

7. The semiconductor device according to claim 2, wherein
said test pattern generation means stores sinusoidal wave test patterns and generates a sinusoidal wave test pattern in accord with a test mode designated by a test mode signal when said test mode is a sinusoidal wave test mode.

8. The semiconductor device according to claim 7, wherein said sinusoidal wave test patterns have different frequencies, amplitudes, and DC biases in combination.

9. The semiconductor device according to claim 8, wherein said sinusoidal wave test pattern has an amplitude with an arbitrary number of lower bits thereof fixed to zero.

10. The semiconductor device according to claim 2, wherein said test pattern generation means stores square wave test patterns to generate a square wave test pattern in accord with a test mode designated by a test mode signal when the test mode is a square wave test mode.

11. The semiconductor device according to claim 10, wherein said square wave test patterns have different periods, duty ratios, amplitudes, and DC biases in combination.

12. The semiconductor device according to claim 11, wherein said square wave test pattern has an amplitude with an arbitrary number of lower bits thereof fixed to zero.

13. The semiconductor device according to claim 2, wherein said DAC is a current additive type DAC which comprises:
a multiplicity of conversion units connected in parallel, each unit having a constant current element controlled by a reference potential and a switching element connected in series with said constant current element and adapted to be turned ON/OFF by a control signal based on said input digital data;
reference potential generation means for generating said reference potential;
a reference potential line for providing said reference potential to each of said constant current elements of said conversion units, wherein
said reference potential generation means has potential feedback means for setting low the impedance of said reference generation means as viewed from said reference potential line.

14. A method of testing a semiconductor device having DACs for converting digital signals into analog signals, by means of a tester having a slower processing speed than said DACs, wherein said tester has means for generating a test clock, and wherein said semiconductor device has test pattern generation means for storing and generating test patterns for testing at least a portion of the performance of said DACs and a clock input terminal which can receive said test clock to drive said test pattern generation means by the test clock, said method comprising steps of:
supplying a test clock from said tester to said test pattern generation means via said clock input terminal;
causing said test pattern generation means to generate a digital test signal in synchronism with said test clock;
supplying said test clock and said digital test signal to said DACs to convert said digital test signal into an analog signal; and
assessing said analog signal by said tester.

* * * * *